United States Patent
Park

(10) Patent No.: US 7,902,746 B2
(45) Date of Patent: Mar. 8, 2011

(54) ORGANIC LIGHT EMITTING DISPLAY AND METHOD OF MANUFACTURING THE SAME

(75) Inventor: Jaehee Park, Kyungbuk (KR)

(73) Assignee: LG Display Co., Ltd., Seoul (KR)

( * ) Notice: Subject to any disclaimer, the term of this patent is extended or adjusted under 35 U.S.C. 154(b) by 99 days.

(21) Appl. No.: 12/314,777

(22) Filed: Dec. 16, 2008

(65) Prior Publication Data

US 2010/0013379 A1    Jan. 21, 2010

(30) Foreign Application Priority Data

Jul. 17, 2008  (KR) .................. 10-2008-0069505

(51) Int. Cl.
  *H01J 1/62* (2006.01)
(52) U.S. Cl. ......................... 313/504; 313/506
(58) Field of Classification Search ............... 313/498, 313/504, 506, 512
  See application file for complete search history.

(56) References Cited

U.S. PATENT DOCUMENTS 7,030,545 B2 * 4/2006 Inoue et al. ............... 313/309

* cited by examiner

*Primary Examiner* — Vip Patel
(74) *Attorney, Agent, or Firm* — Morgan, Lewis & Bockius LLP

(57) ABSTRACT

An organic light emitting display and a method of manufacturing the same are disclosed. The organic light emitting display includes a transistor including a gate, a source, and a drain on a substrate, a connection electrode that is positioned on the transistor to be connected to the source or the drain, a first sacrifice layer that is positioned on the connection electrode to expose a portion of the connection electrode, a second sacrifice layer that is positioned on the first sacrifice layer to expose a portion of the connection electrode, a lower electrode on the connection electrode and the second sacrifice layer, an organic light emitting layer on the lower electrode, and an upper electrode on the organic light emitting layer. The first sacrifice layer is formed within range of a length of the second sacrifice layer inside the second sacrifice layer.

5 Claims, 9 Drawing Sheets

ORGANIC LIGHT EMITTING DISPLAY AND METHOD OF MANUFACTURING THE SAME

This application claims the benefit of Korean Patent Application No. 10-2008-0069505 filed on Jul. 17, 2008, which is hereby incorporated by reference in its entirety.

BACKGROUND OF THE INVENTION

1. Field of the Invention

The present invention relate to an organic light emitting display and a method of manufacturing the same.

2. Description of the Related Art

An organic light emitting element used in an organic light emitting display has a self-emission structure in which a light emitting layer is formed between two electrodes on a substrate.

The organic light emitting element is classified into a top or emission type organic light emitting element and a bottom emission type organic light emitting element depending on a direction in which light is emitted. The organic light emitting element is also classified into a passive or matrix type organic light emitting element and an active matrix type organic light emitting element depending on a manner in which the display is driven.

In the organic light emitting display, a scan signal, a data signal, a power, etc. are supplied to a plurality of subpixels arranged in a matrix format and light is emitted from the selected subpixels, thereby displaying an image.

In a related art organic light emitting display, a cathode electrode is formed on a transistor including a gate, a source, and a drain to be connected to the source or the drain of the transistor, and a chamber moves, thereby forming an organic light emitting layer and an anode electrode.

However, because the cathode electrode is oxidized during a formation of the cathode electrode in the related art organic light emitting display, the electron injection efficiency is reduced. Further, a short circuit occurs between the cathode electrodes during the formation of the cathode electrode, or an open circuit of the anode electrode occurs by a difference between heights of thin films.

SUMMARY OF THE INVENTION

Additional features and advantages of the exemplary embodiments of the invention will be set forth in the description which follows, and in part will be apparent from the description, or may be learned by practice of the exemplary embodiments of the invention. The objectives and other advantages of the exemplary embodiments of the invention will be realized and attained by the structure particularly pointed out in the written description and claims hereof as well as the appended drawings.

In one aspect, an organic light emitting display comprises a substrate, a transistor on the substrate, the transistor including a gate, a source, and a drain, a connection electrode that is positioned on the transistor to be connected to the source or the drain of the transistor, a first sacrifice layer that is positioned on the connection electrode to expose a portion of the connection electrode, a second sacrifice layer that is positioned on the first sacrifice layer to expose a portion of the connection electrode, a lower electrode on the connection electrode and the second sacrifice layer, an organic light emitting layer on the lower electrode, and an upper electrode on the organic light emitting layer, wherein the first sacrifice layer is formed within range of a length of the second sacrifice layer inside the second sacrifice layer.

In another aspect, an organic light emitting display comprises a substrate, a transistor on the substrate, the transistor including a gate, a source, and a drain, a connection electrode that is positioned on the transistor to be connected to the source or the drain of the transistor, a sacrifice layer that is positioned on the connection electrode to expose a portion of the connection electrode, a bank layer that is positioned on the sacrifice layer to expose a portion of the connection electrode, a lower electrode on the connection electrode and the bank layer, an organic light emitting layer on the lower electrode, and an upper electrode on the organic light emitting layer, wherein the sacrifice layer is formed within range of a length of the bank layer inside the bank layer.

In yet another aspect, a method of an organic light emitting display comprises forming a transistor including a gate, a source, and a drain on a substrate, forming a connection electrode on the transistor to be connected to the source or the drain of the transistor, forming a first sacrifice layer on the connection electrode, forming a second sacrifice layer on the first sacrifice layer, forming a photoresist on the second sacrifice layer to expose a portion of the second sacrifice layer, removing the second sacrifice layer using a first etching method so that the second sacrifice layer is formed within range of a length of the photoresist inside the photoresist, removing the first sacrifice layer using a second etching method so that the first sacrifice layer is formed within range of a length of the second sacrifice layer inside the second sacrifice layer, removing the photoresist, forming a lower electrode on the connection electrode, forming an organic light emitting layer on the lower electrode, and forming an upper electrode on the organic light emitting layer.

In yet still another aspect, a method of an organic light emitting display comprises forming a transistor including a gate, a source, and a drain on a substrate, forming a connection electrode on the transistor to be connected to the source or the drain of the transistor, forming a sacrifice layer on the connection electrode, forming a bank layer on the sacrifice layer to expose a portion of the sacrifice layer, removing the sacrifice layer using an etching method so that the sacrifice layer is formed within range of a length of the bank layer inside the bank layer, forming a lower electrode on the connection electrode, forming an organic light emitting layer on the lower electrode, and forming an upper electrode on the organic light emitting layer.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF EMBODIMENTS

Reference will now be made in detail embodiments of the invention examples of which are illustrated in the accompanying drawings.

First Exemplary Embodiment

Figure 1:
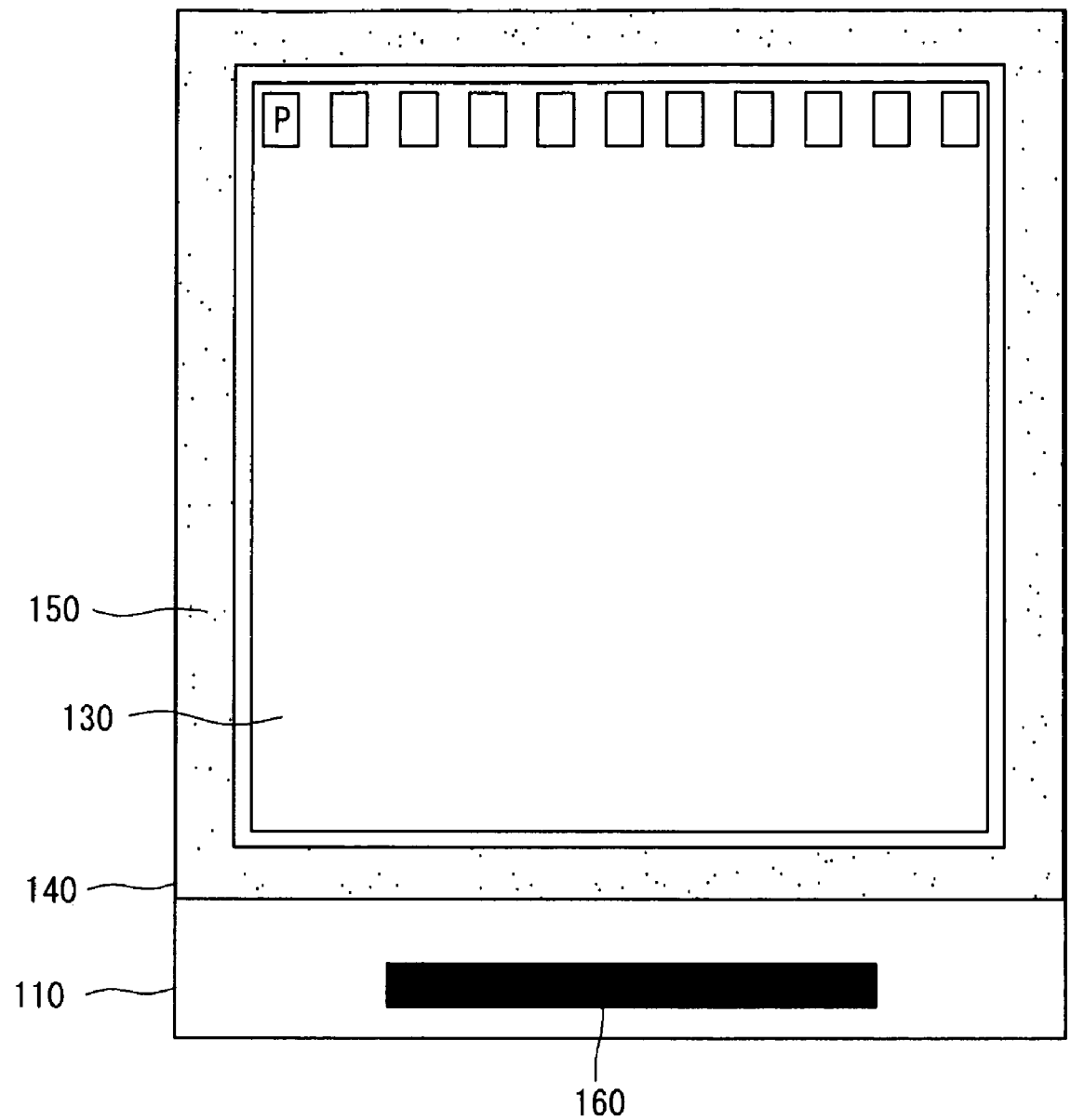
FIG. 1 is a plane view sequentially illustrating an organic light emitting display according to a first exemplary embodiment of the invention.

As shown in FIG. 1, an organic light emitting display may include a display unit 130 including a plurality of subpixels P on a substrate 110.

The substrate 110 may be formed of a material of which a mechanical strength or size stability are excellent. The substrate 110 may be a glass substrate, a metal substrate, a ceramic substrate, or a plastic substrate. The plastic substrate may be formed of polycarbonate resin, acrylic resin, vinyl chloride resin, polyethyleneterephthalate resin, polyimide resin, polyester resin, epoxy resin, silicon resin, and fluorine resin, but is not limited thereto.

Each subpixel P may include a transistor on the substrate 110 and an organic light emitting diode on the transistor.

The subpixels P on the substrate 110 are weak in moisture or oxygen. Therefore, the substrate 110 and a seal substrate 140 are encapsulated using an adhesive member 150 formed outside the display unit 130.

The subpixels P are driven by a driver 160 on the substrate 110, thereby displaying an image. The driver 160 can produces a scan signal, a data signal, etc. in response to various signals received from the outside and can supply the produced signals to the subpixels P.

The driver 160 may include a scan driver supplying the scan signals to the subpixels P and a data driver supplying the data signals to the subpixels P. In FIG. 1, the scan driver and the data driver are formed on one board, but at least one of the scan driver and the data driver may be positioned on the substrate 110 or outside the substrate 110.

Figure 2:
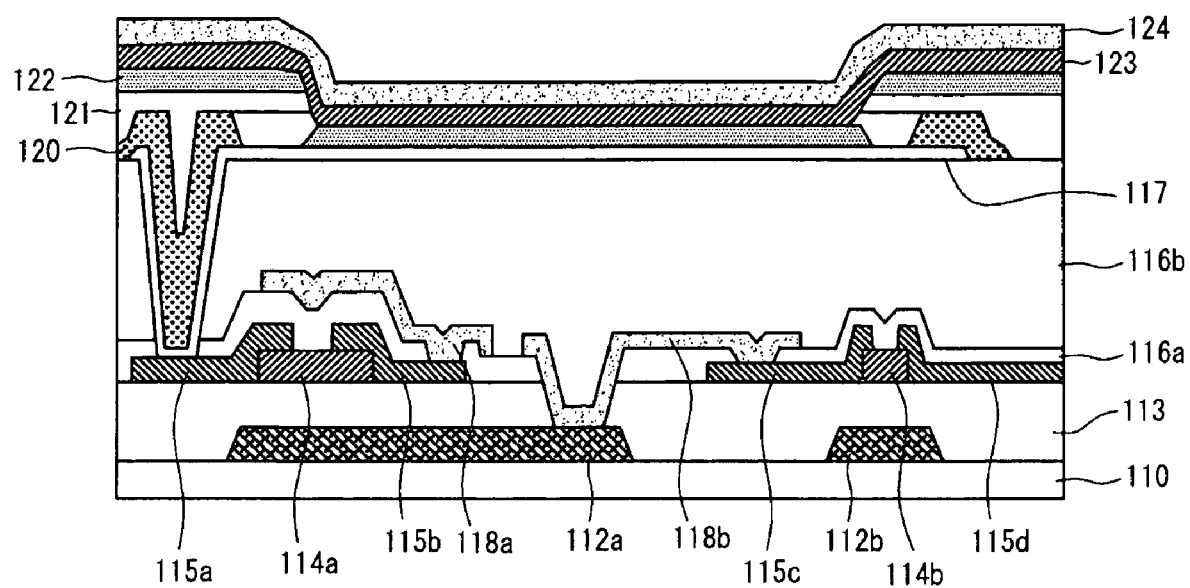
FIG. 2 is a cross-sectional view of a subpixel according to the first exemplary embodiment of the invention.

FIG. 2 is a cross-sectional view of a subpixel according to the first exemplary embodiment of the invention.

As shown in FIG. 2, gates 112a and 112b may be positioned on the substrate 110. The gates 112a and 112b may be formed of any one selected from the group consisting of molybdenum (Mo), aluminum (Al), chromium (Cr), gold (Au), titanium (Ti), nickel (Ni), neodymium (Nd) and copper (Cu), or a combination thereof, but is not limited thereto. The gates 112a and 112b may have a multi-layered structure formed of Mo, Al, Cr, Au, Ti, Ni, Nd, or Cu, or a combination thereof. For example, the gates 112a and 112b may have a double-layered structure including Mo/Al—Nd or Mo/Al.

A first insulating layer 113 may be positioned on the gates 112a and 112b. The first insulating layer 113 may include a silicon oxide ($SiO_x$) layer, a silicon nitride ($SiN_x$) layer, or a multi-layered structure or a combination thereof, but is not limited thereto.

Active layers 114a and 114b may be positioned on the first insulating layer 113. The active layers 114a and 114b may be formed of amorphous silicon or crystallized polycrystalline silicon. Although it is not shown, the active layers 114a and 114b may include a channel region, a source region, and a drain region. The source region and the drain region may be doped with p-type or n-type impurities. The active layers 114a and 114b may include an ohmic contact layer for reducing a contact resistance.

Sources 115a and 115c and drains 115b and 115d may be positioned on the active layers 114a and 114b. The sources 115a and 115c and the drains 115b and 115d may have a single-layered structure or a multi-layered structure. When the sources 115a and 115c and the drains 115b and 115d have the single-layered structure, the sources 115a and 115c and the drains 115b and 115d may be formed of Mo, Al, Cr, Au, Ti, Ni, Nd, or Cu, or a combination thereof. When the sources 115a and 115c and the drains 115b and 115d have the multi-layered structure, the sources 115a and 115c and the drains 115b and 115d may have a double-layered structure including Mo/Al—Nd or a triple-layered structure including Mo/Al/Mo or Mo/Al—Nd/Mo.

A second insulating layer 116a may be positioned on the sources 115a and 115c and the drains 115b and 115d. The second insulating layer 116a may include a silicon oxide ($SiO_x$) layer, a silicon nitride ($SiN_x$) layer, or a multi-layered structure or a combination thereof, but is not limited thereto. The second insulating layer 116a may be a passivation layer.

The transistor including the gate 112a, the source 115a, and the drain 115b may be used as a drive transistor, and the transistor including the gate 112b, the source 115c, and the drain 115d may be used as a switching transistor. One of the source 115a and the drain 115b of the drive transistor may be connected to a shield metal 118a on the second insulating layer 116a. One of the source 115a or the drain 115b of the drive transistor may be connected to one of the source 115c and the drain 115d of the switching transistor.

A third insulating layer 116b may be positioned on the second insulating layer 116a to increase a planarization level. The third insulating layer 116b may be formed of an organic material such as polyimide.

A case where the transistor on the substrate 110 is a bottom gate transistor was described above as an example. However, the transistor on the substrate 110 may be a top gate transistor.

A connection electrode 117 may be positioned on the third insulating layer 116b to be connected to the source 115a or the drain 115b of the drive transistor.

A first sacrifice layer 120 may be positioned on the connection electrode 117 to expose a portion of the connection electrode 117. The first sacrifice layer 120 may include an inorganic insulating layer formed of silicon oxide ($SiO_x$) or silicon nitride ($SiN_x$).

A second sacrifice layer 121 may be positioned on the first sacrifice layer 120 to expose a portion of the connection electrode 117. The second sacrifice layer 121 may be formed of metal or metal oxide. When the second sacrifice layer 121 is formed of metal or metal oxide, an undercut pattern is easy to form and the second sacrifice layer 121 serves as an auxiliary electrode of a lower electrode 122.

The first sacrifice layer 120 may be patterned in an undercut form so that the first sacrifice layer 120 is formed within the range of the length of the second sacrifice layer 121 inside the second sacrifice layer 121. When the first sacrifice layer 120 is formed of the inorganic insulating layer and the second sacrifice layer 121 is formed of metal or metal oxide, the first sacrifice layer 120 can be thinly formed to have a thickness equal to or less than 500 Å during an undercut process. Hence, an open circuit of an upper electrode caused by a difference between heights of the undercut patterns (for example, a difference between heights of organic light emitting layers) can be prevented. Further, the thicknesses of the first sacrifice layer 120 and the second sacrifice layer 121 used in the undercut process can be minimized, and the depth of the undercut pattern can be adjusted.

The lower electrode 122 may be positioned on the connection electrode 117. The lower electrode 122 may be dividedly formed in each subpixel by the undercut first sacrifice layer 120 and the second sacrifice layer 121. The lower electrode 122 may be a cathode electrode. The lower electrode 122 may be formed of an opaque material having a low work function such as Al and Al alloy, but is not limited thereto.

An organic light emitting layer 123 may be positioned on the lower electrode 122. The organic light emitting layer 123 may emit one of red, green, and blue light depending on the subpixel.

An upper electrode 124 may be positioned on the organic light emitting layer 123. The upper electrode 124 may be formed throughout an upper portion of each subpixel. The upper electrode 124 may be an anode electrode. The upper electrode 124 may be formed of a transparent material such as indium tin oxide (ITO), indium zinc oxide (IZO), indium tin zinc oxide (ITZO) and ZnO-doped $Al_2O_3$ (AZO), but is not limited thereto.

Figure 3:
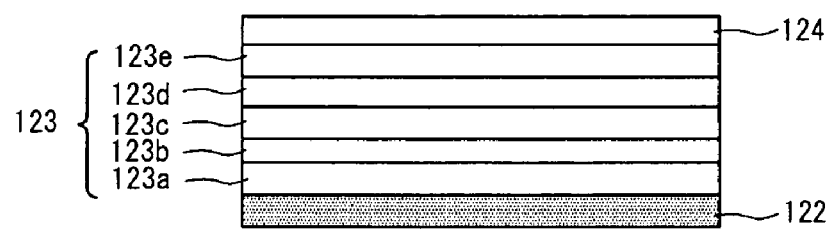
FIG. 3 is a cross-sectional view illustrating a structure of an organic light emitting diode shown in FIG. 2.

FIG. 3 is a cross-sectional view illustrating a structure of an organic light emitting diode including the organic light emitting layer 123.

As shown in FIG. 3, the organic light emitting diode may include the lower electrode 122, an electron injection layer 123a, an electron transport layer 123b, a light emitting layer 123c, a hole transport layer 123d, a hole injection layer 123e, and the upper electrode 124.

The electron injection layer 123a functions to facilitate the injection of electrons. The electron injection layer 123a may be formed of Alq3(tris(8-hydroxyquinolino)aluminum), PBD, TAZ, spiro-PBD, BAlq or SAlq, but is not limited thereto.

The electron transport layer 123b functions to facilitate the transportation of electrons. The electron transport layer 123b may be formed of at least one selected from the group consisting of Alq3(tris(8-hydroxyquinolino)aluminum, PBD, TAZ, spiro-PBD, BAlq, and SAlq, but is not limited thereto.

The light emitting layer 123c may be formed of a material capable of producing red, green, blue and white light, for example, a phosphorescence material or a fluorescence material.

In case the light emitting layer 123c produces red light, the light emitting layer 123c includes a host material including carbazole biphenyl (CBP) or N,N-dicarbazolyl-3,5-benzene (mCP). Further, the light emitting layer 123c may be formed of a phosphorescence material including a dopant material including any one selected from the group consisting of PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum) or a fluorescence material including PBD:Eu(DBM)3(Phen) or Perylene, but is not limited thereto.

In case the light emitting layer 123c produces green light, the light emitting layer 123c includes a host material including CBP or mCP. Further, the light emitting layer 123c may be formed of a phosphorescence material including a dopant material including Ir(ppy)3(fac tris(2-phenylpyridine)iridium) or a fluorescence material including Alq3(tris(8-hydroxyquinolino)aluminum), but is not limited thereto.

In case the light emitting layer 123c produces blue light, the light emitting layer 123c includes a host material including CBP or mCP. Further, the light emitting layer 123c may be formed of a phosphorescence material including a dopant material including (4,6-F2ppy)2Irpic or a fluorescence material including any one selected from the group consisting of spiro-DPVBi, spiro-6P, distyryl-benzene (DSB), distyryl-arylene (DSA), PFO-based polymer, PPV-based polymer and a combination thereof, but is not limited thereto.

The hole transport layer 123d functions to smoothly transport holes. The hole transport layer 123d may be formed from at least one selected from the group consisting of NPD(N,N-dinaphthyl-N,N'-diphenyl benzidine), TPD(N,N'-bis-(3-methylphenyl)-N,N'-bis-(phenyl)-benzidine, s-TAD and MTDATA(4,4',4'-Tris(N-3-methylphenyl-N-phenyl-amino)-triphenylamine), but is not limited thereto.

The hole injection layer 123e may function to facilitate the injection of holes to the light emitting layer 123c. The hole injection layer 123e may be formed of at least one selected from the group consisting of copper phthalocyanine (CuPc), PEDOT(poly(3,4)-ethylenedioxythiophene), polyaniline (PANI) and NPD(N,N-dinaphthyl-N,N'-diphenyl benzidine), but is not limited thereto.

At least one of the electron injection layer 123a, the electron transport layer 123b, the hole transport layer 123d, and the hole injection layer 123e may be omitted.

A method of manufacturing the organic light emitting display according to the first exemplary embodiment of the invention will be described below.

Figure 4:
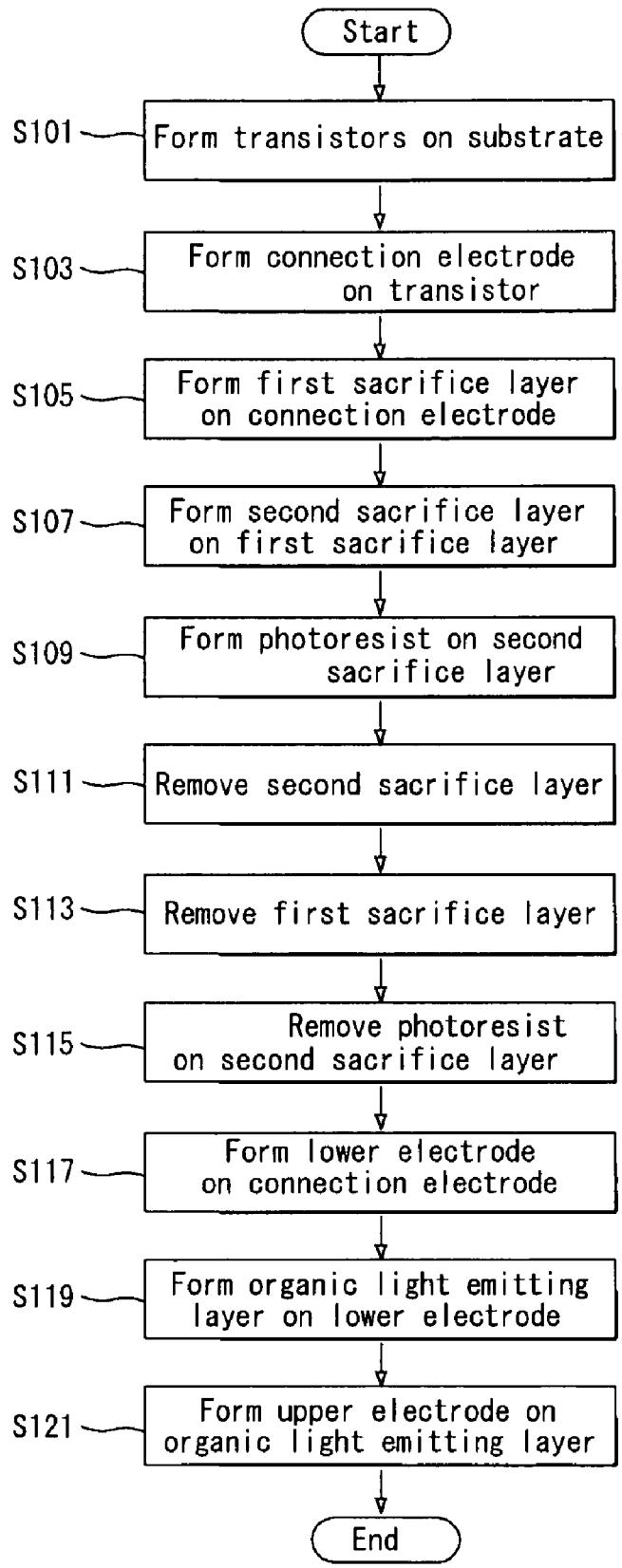
FIG. 4 is a flow chart schematically illustrating a method of manufacturing the organic light emitting display according to the first exemplary embodiment of the invention.
Figure 5:
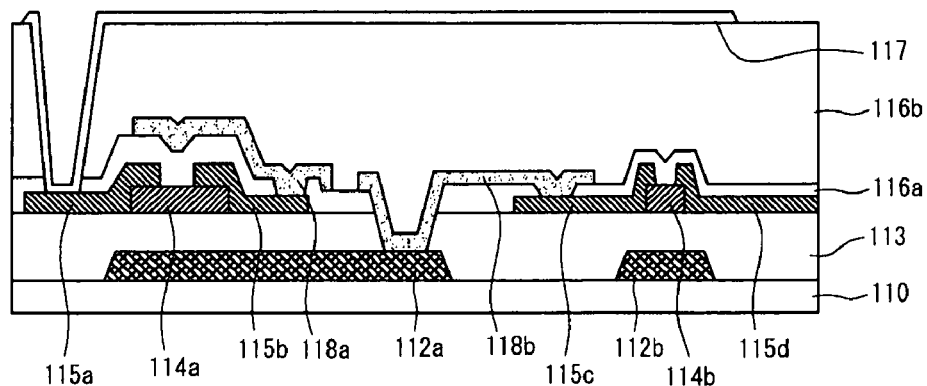
FIGS. 5 to 9 are cross-sectional views sequentially illustrating each of stages in the method of manufacturing the organic light emitting display.

As shown in FIGS. 4 and 5, the transistors including the gates 112a and 112b, the sources 115a and 115c, and the drains 115b and 115d are formed on the substrate 110 in step S101.

More specifically, the gates 112a and 112b are formed on the substrate 110. The first insulating layer 113 is formed on the gates 112a and 112b. The active layers 114a and 114b are formed on the first insulating layer 113. The sources 115a and 115c and the drains 115b and 115d are formed on the active layers 114a and 114b. The second insulating layer 116a is formed on the sources 115a and 115c and the drains 115b and 115d. The third insulating layer 116b is formed on the second insulating layer 116a to increase a planarization level.

The transistor including the gate 112a, the source 115a, and the drain 115b may be used as a drive transistor, and the transistor including the gate 112b, the source 115c, and the drain 115d may be used as a switching transistor. One of the source 115a and the drain 115b of the drive transistor may be connected to the shield metal 118a on the second insulating layer 116a. One of the source 115a or the drain 115b of the drive transistor may be connected to one of the source 115c and the drain 115d of the switching transistor.

A case where the transistor on the substrate 110 is a bottom gate transistor was described above as an example. However, the transistor on the substrate 110 may be a top gate transistor.

As shown in FIGS. 4 and 5, the connection electrode 117 is formed on the transistor to be connected to the source 115a or the drain 115b of the drive transistor in step S103.

More specifically, the connection electrode 117 is formed on the third insulating layer 116b to be connected to the source 115a or the drain 115b of the drive transistor.

Figure 6:
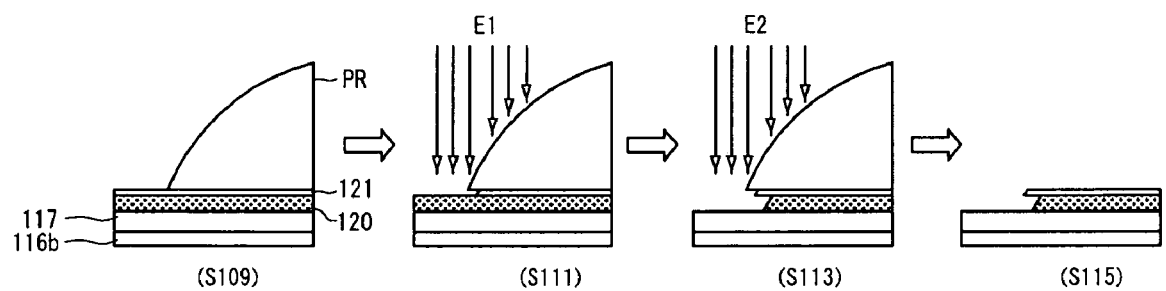

As shown in FIGS. 4 and 6, the first sacrifice layer 120 is formed on the connection electrode 117 in step S105.

More specifically, the first sacrifice layer 120 is formed on the connection electrode 117 to expose a portion of the connection electrode 117. The first sacrifice layer 120 may include an inorganic insulating layer formed of silicon oxide ($SiO_x$) or silicon nitride ($SiN_x$). In the first exemplary embodiment of the invention, the first sacrifice layer 120 is formed of silicon nitride ($SiN_x$) as an example.

As shown in FIGS. 4 and 6, the second sacrifice layer 121 is formed on the first sacrifice layer 120 in step S107.

More specifically, the second sacrifice layer 121 is formed on the first sacrifice layer 120 to expose a portion of the connection electrode 117. The second sacrifice layer 121 may be formed of metal or metal oxide. In the first exemplary embodiment of the invention, the second sacrifice layer 121 is formed of ITO as an example.

As shown in FIGS. 4 and 6, a photoresist PR is formed on the second sacrifice layer 121 to expose a portion of the second sacrifice layer 121 in step S109.

As shown in FIGS. 4 and 6, the portion of the second sacrifice layer 121 exposed by the photoresist PR is removed using a first etching method E1 in step S111 so that the second sacrifice layer 121 is formed within the range of the length of the photoresist PR inside the photoresist PR. The first etching method E1 may be a wet etching method, but is not limited thereto.

As shown in FIGS. 4 and 6, the first sacrifice layer 120 is removed using a second etching method E2 in step S113 so that the first sacrifice layer 120 is formed within the range of the length of the second sacrifice layer 121 inside the second sacrifice layer 121. The second etching method E2 may be a dry etching method using sulfur hexafluoride ($SF_6$) and oxygen ($O_2$), but is not limited thereto.

In the second etching method E2, the amount of sulfur hexafluoride ($SF_6$) may be more than the amount of oxygen ($O_2$). Hence, the photoresist PR is relatively slightly etched during a performance of the second etching method E2. Further, etching time does not have to be adjusted during the undercut process.

Figure 7:
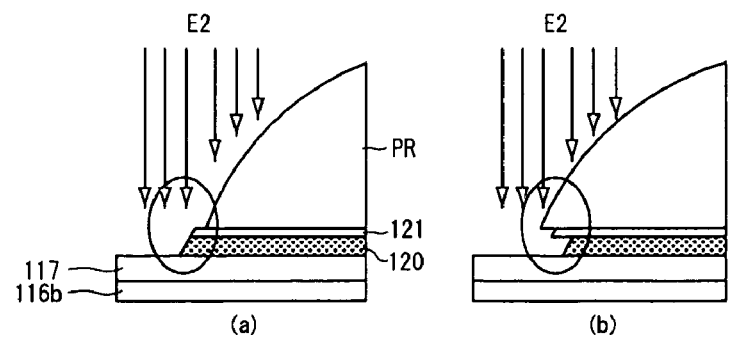

FIG. 7 shows an etching shape depending on the amount of each of sulfur hexafluoride ($SF_6$) and oxygen ($O_2$) used to remove the first sacrifice layer 120. In FIG. 7, (a) shows a case where the amount of sulfur hexafluoride ($SF_6$) is less than the amount of oxygen ($O_2$), and (b) shows a case where the amount of sulfur hexafluoride ($SF_6$) is more than the amount of oxygen ($O_2$). As can be seen from FIG. 7, when the amount of sulfur hexafluoride ($SF_6$) is more than the amount of oxygen ($O_2$) in the second etching method E2, the first sacrifice layer 120 can be formed within the range of the length of the second sacrifice layer 121 inside the second sacrifice layer 121.

As shown in FIGS. 4 and 6, the photoresist PR on the second sacrifice layer 121 is removed in step S115.

Figure 8:
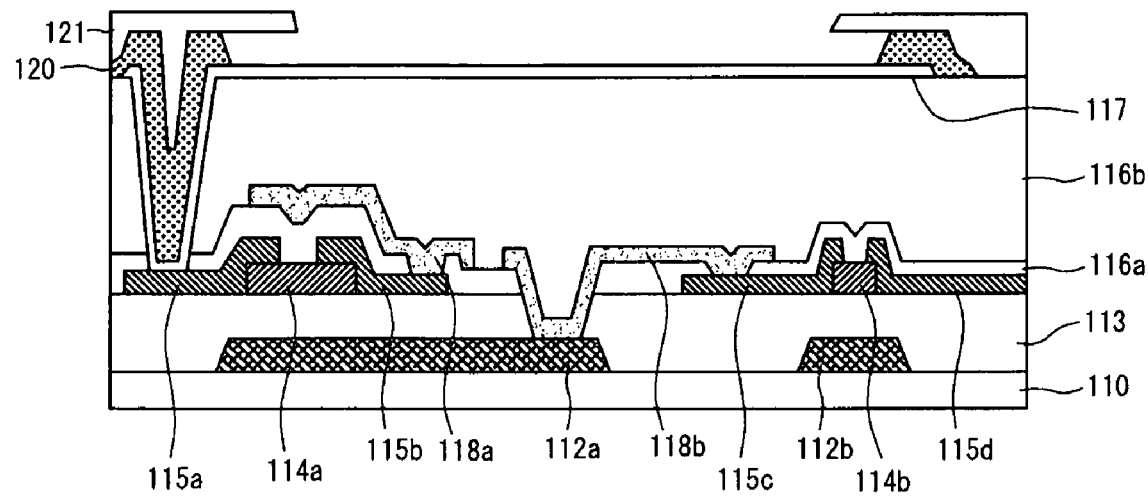

A structure shown in FIG. 8 is obtained by performing the above steps.

Figure 9:
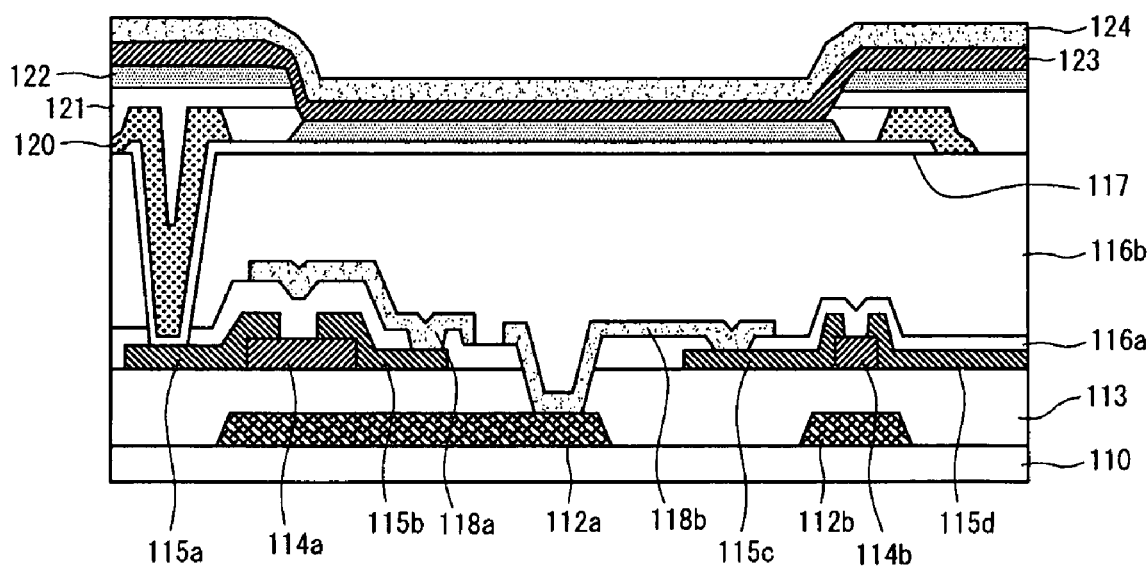

As shown in FIGS. 4 and 9, the lower electrode 122 is formed on the connection electrode 117 in step S117.

More specifically, the lower electrode 122 is formed on the second sacrifice layer 121 as well as the connection electrode 117. The lower electrode 122 may be dividedly formed in each subpixel by the undercut first sacrifice layer 120 and the second sacrifice layer 121. The lower electrode 122 may be a cathode electrode. The lower electrode 122 may be formed of an opaque material having a low work function such as Al and Al alloy, but is not limited thereto.

As shown in FIGS. 4 and 9, the organic light emitting layer 123 is formed on the lower electrode 122 in step S119. The organic light emitting layer 123 on the lower electrode 122 may emit one of red, green, and blue light depending on the subpixel.

As shown in FIGS. 4 and 9, the upper electrode 124 is formed on the organic light emitting layer 123 in step S121.

More specifically, the upper electrode 124 on the organic light emitting layer 123 may be formed throughout an upper portion of each subpixel. The upper electrode 124 may be an anode electrode. The upper electrode 124 may be formed of a transparent material such as ITO, IZO, ITZO, and ZnO-doped $Al_2O_3$ (AZO), but is not limited thereto.

In the first exemplary embodiment of the invention, because the first sacrifice layer 120 is formed of the inorganic insulating layer and the second sacrifice layer 121 is formed of metal or metal oxide, the first sacrifice layer 120 can be thinly formed to have the thickness equal to or less than 500 Å during the undercut process. Hence, an open circuit of the upper electrode 124 caused by a difference between heights of the undercut patterns (for example, a difference between heights of the organic light emitting layers 123) can be prevented. Further, the thicknesses of the first sacrifice layer 120 and the second sacrifice layer 121 used in the undercut process can be minimized, and the depth of the undercut pattern can be adjusted. Because the lower electrode 122, the organic light emitting layer 123, and the upper electrode 124 are formed through the undercut process, the oxidization of the lower electrode 122 can be prevented. Because the oxidization of the lower electrode 122 is prevented, electron injection characteristics and light emitting efficiency can be improved. Because the second sacrifice layer 121 is formed of metal or metal oxide, a resistance of the lower electrode 122 can be reduced. Because the first sacrifice layer 120 is formed of the inorganic insulating layer, an out-gassing influence (for example, the subpixel shrinkage) of organic materials under the first sacrifice layer 120 can be minimized.

Second Exemplary Embodiment

Figure 10:
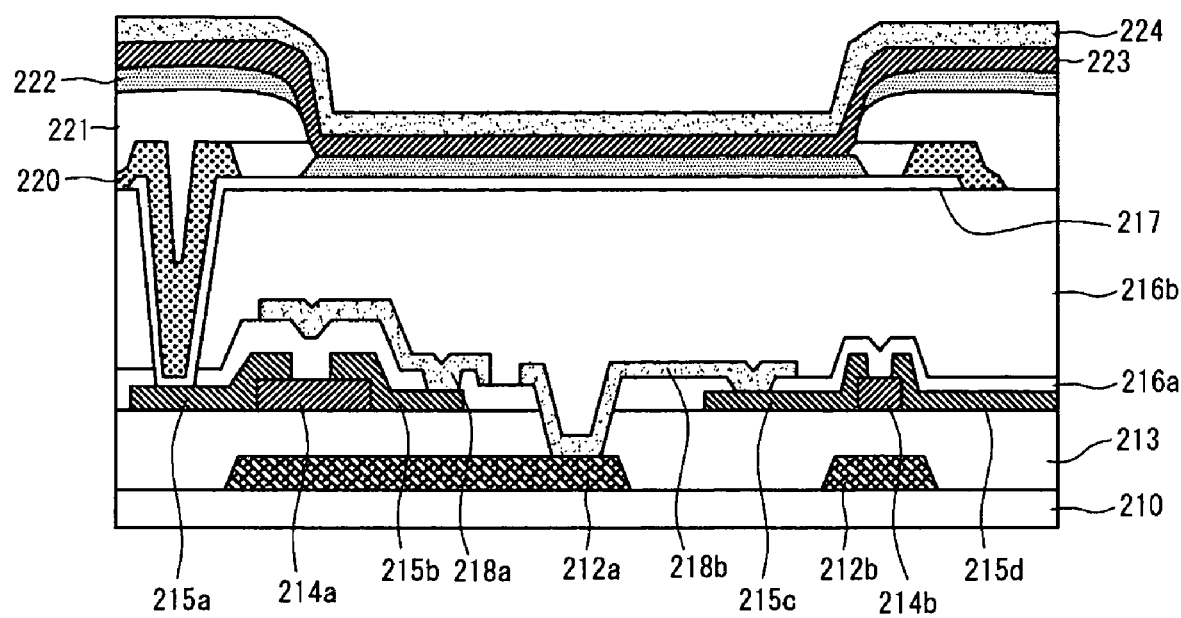
FIG. 10 is a cross-sectional view of a subpixel according to a second exemplary embodiment of the invention.

As shown in FIG. 10, gates 212a and 212b may be positioned on the substrate 210. The gates 212a and 212b may be formed of any one selected from the group consisting of molybdenum (Mo), aluminum (Al), chromium (Cr), gold (Au), titanium (Ti), nickel (Ni), neodymium (Nd) and copper (Cu), or a combination thereof, but is not limited thereto. The gates 212a and 212b may have a multi-layered structure formed of Mo, Al, Cr, Au, Ti, Ni, Nd, or Cu, or a combination thereof. For example, the gates 212a and 212b may have a double-layered structure including Mo/Al—Nd or Mo/Al.

A first insulating layer 213 may be positioned on the gates 212a and 212b. The first insulating layer 213 may include a silicon oxide ($SiO_x$) layer, a silicon nitride ($SiN_x$) layer, or a multi-layered structure or a combination thereof, but is not limited thereto.

Active layers 214a and 214b may be positioned on the first insulating layer 213. The active layers 214a and 214b may be formed of amorphous silicon or crystallized polycrystalline silicon. Although it is not shown, the active layers 214a and 214b may include a channel region, a source region, and a drain region. The source region and the drain region may be doped with p-type or n-type impurities. The active layers 214a and 214b may include an ohmic contact layer for reducing a contact resistance.

Sources 215a and 215c and drains 215b and 215d may be positioned on the active layers 214a and 214b. The sources 215a and 215c and the drains 215b and 215d may have a single-layered structure or a multi-layered structure. When the sources 215a and 215c and the drains 215b and 215d have the single-layered structure, the sources 215a and 215c and the drains 215b and 215d may be formed of Mo, Al, Cr, Au, Ti, Ni, Nd, or Cu, or a combination thereof. When the sources 215a and 215c and the drains 215b and 215d have the multi-layered structure, the sources 215a and 215c and the drains 215b and 215d may have a double-layered structure including Mo/Al—Nd or a triple-layered structure including Mo/Al/Mo or Mo/Al—Nd/Mo.

A second insulating layer 216a may be positioned on the sources 215a and 215c and the drains 215b and 215d. The second insulating layer 216a may include a silicon oxide ($SiO_x$) layer, a silicon nitride ($SiN_x$) layer, or a multi-layered structure or a combination thereof, but is not limited thereto. The second insulating layer 216a may be a passivation layer.

The transistor including the gate 212a, the source 215a, and the drain 215b may be used as a drive transistor, and the transistor including the gate 212b, the source 215c, and the drain 215d may be used as a switching transistor. One of the source 215a and the drain 215b of the drive transistor may be connected to a shield metal 218a on the second insulating layer 216a. One of the source 215a or the drain 215b of the drive transistor may be connected to one of the source 215c and the drain 215d of the switching transistor.

A third insulating layer 216b may be positioned on the second insulating layer 216a to increase a planarization level. The third insulating layer 216b may be formed of an organic material such as polyimide.

A case where the transistor on the substrate 210 is a bottom gate transistor was described above as an example. However, the transistor on the substrate 210 may be a top gate transistor.

A connection electrode 217 may be positioned on the third insulating layer 216b to be connected to the source 215a or the drain 215b of the drive transistor.

A sacrifice layer 220 may be positioned on the connection electrode 217 to expose a portion of the connection electrode 217. The sacrifice layer 220 may include an inorganic insulating layer formed of silicon oxide ($SiO_x$) or silicon nitride ($SiN_x$).

A bank layer 221 may be positioned on the sacrifice layer 220 to expose a portion of the connection electrode 217. The bank layer 221 may be formed of an organic material such as benzocyclobutene (BCB)-based resin, acrylic resin, or polyimide resin.

The sacrifice layer 220 may be patterned in an undercut form so that the sacrifice layer 220 is formed within the range of the length of the bank layer 221 inside the bank layer 221. When the sacrifice layer 220 is formed of the inorganic insulating layer and is undercut, the sacrifice layer 220 can be thinly formed to have a thickness equal to or less than 500 Å during an undercut process. Hence, an open circuit of an upper electrode caused by a difference between heights of the undercut patterns (for example, a difference between heights of organic light emitting layers) can be prevented.

The lower electrode 222 may be positioned on the connection electrode 217. The lower electrode 222 may be dividedly formed in each subpixel by the undercut sacrifice layer 220. The lower electrode 222 may be a cathode electrode. The lower electrode 222 may be formed of an opaque material having a low work function such as Al and Al alloy, but is not limited thereto. An organic light emitting layer 223 may be positioned on the lower electrode 222. The organic light emitting layer 223 may emit one of red, green, and blue light depending on the subpixel.

An upper electrode 224 may be positioned on the organic light emitting layer 223. The upper electrode 224 may be formed throughout an upper portion of each subpixel. The upper electrode 224 may be an anode electrode. The upper electrode 224 may be formed of a transparent material such as indium tin oxide (ITO), indium zinc oxide (IZO), indium tin zinc oxide (ITZO) and ZnO-doped $Al_2O_3$ (AZO), but is not limited thereto.

Figure 11:
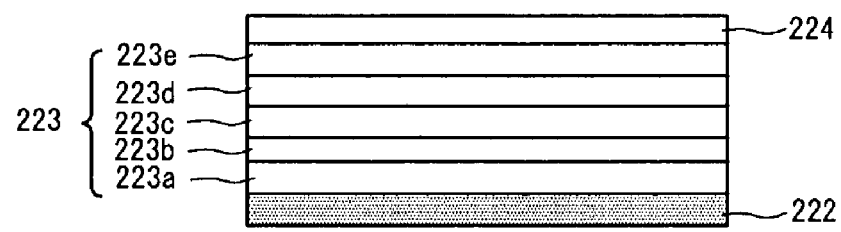
FIG. 11 is a cross-sectional view illustrating a structure of an organic light emitting diode shown in FIG. 10.

FIG. 11 is a cross-sectional view illustrating a structure of an organic light emitting diode including the organic light emitting layer 223.

As shown in FIG. 11, the organic light emitting diode may include the lower electrode 222, an electron injection layer 223a, an electron transport layer 223b, a light emitting layer 223c, a hole transport layer 223d, a hole injection layer 223e, and the upper electrode 224.

At least one of the electron injection layer 223a, the electron transport layer 223b, the hole transport layer 223d, and the hole injection layer 223e may be omitted.

A method of manufacturing the organic light emitting display according to the second exemplary embodiment of the invention will be described below.

Figure 12:
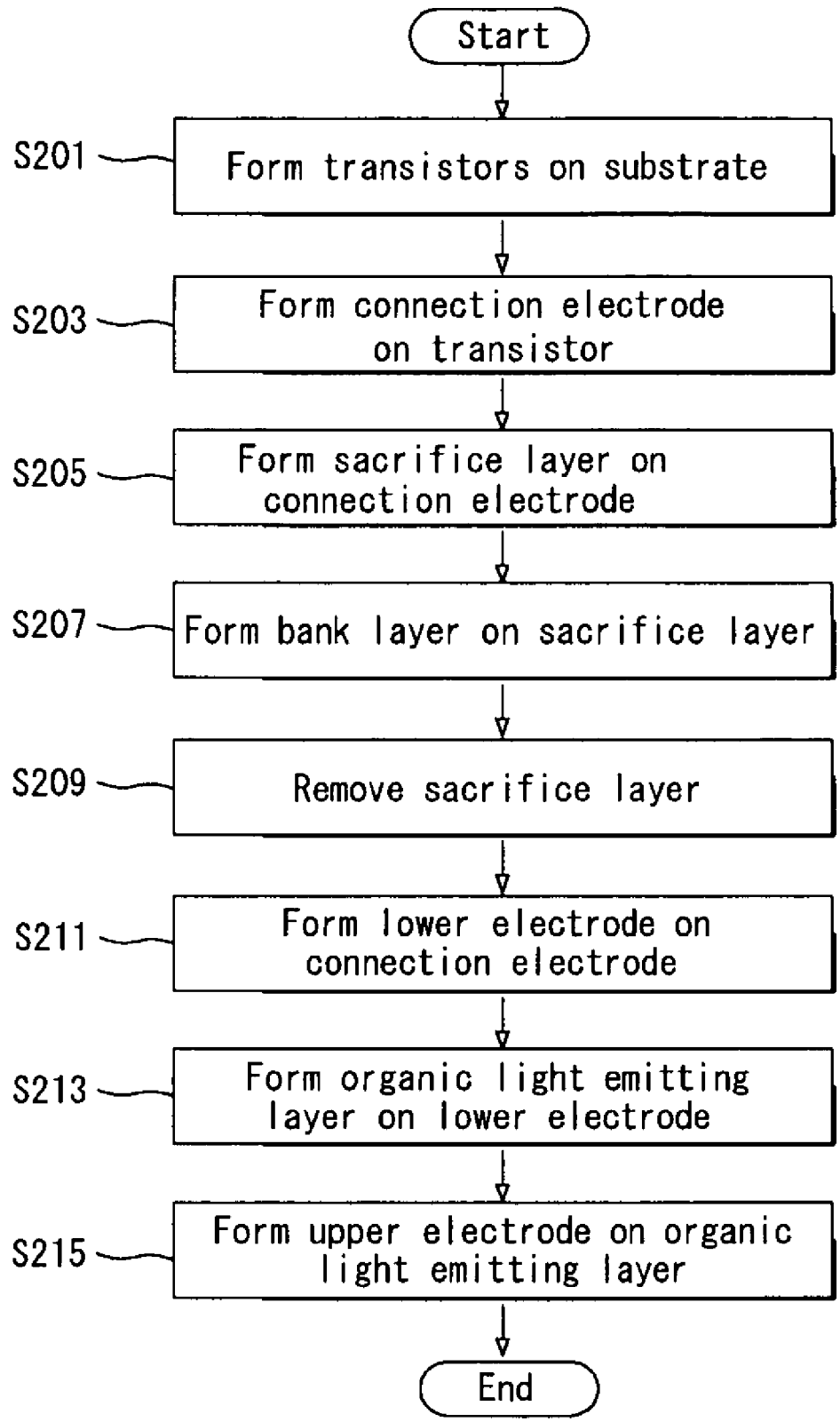
FIG. 12 is a flow chart schematically illustrating a method of manufacturing an organic light emitting display according to the second exemplary embodiment of the invention.
Figure 13:
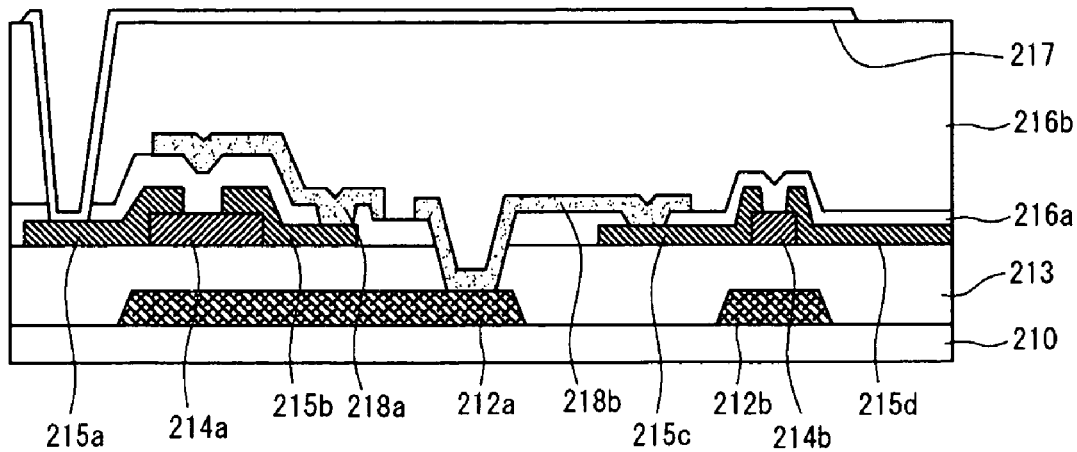
FIGS. 13 to 17 are cross-sectional views sequentially illustrating each of stages in the method of manufacturing the organic light emitting display.

As shown in FIGS. 12 and 13, the transistors including the gates 212a and 212b, the sources 215a and 215c, and the drains 215b and 215d are formed on the substrate 210 in step S201.

More specifically, the gates 212a and 212b are formed on the substrate 210. The first insulating layer 213 is formed on the gates 212a and 212b. The active layers 214a and 214b are formed on the first insulating layer 213. The sources 215a and 215c and the drains 215b and 215d are formed on the active layers 214a and 214b. The second insulating layer 216a is formed on the sources 215a and 215c and the drains 215b and 215d. The third insulating layer 216b is formed on the second insulating layer 216a to increase a planarization level.

The transistor including the gate 212a, the source 215a, and the drain 215b may be used as a drive transistor, and the transistor including the gate 212b, the source 215c, and the drain 215d may be used as a switching transistor. One of the source 215a and the drain 215b of the drive transistor may be connected to the shield metal 218a on the second insulating layer 216a. One of the source 215a or the drain 215b of the drive transistor may be connected to one of the source 215c and the drain 215d of the switching transistor.

A case where the transistor on the substrate 210 is a bottom gate transistor was described above as an example. However, the transistor on the substrate 210 may be a top gate transistor.

As shown in FIGS. 12 and 13, the connection electrode 217 is formed on the transistor to be connected to the source 215a or the drain 215b of the drive transistor in step S203.

More specifically, the connection electrode 217 is formed on the third insulating layer 216b to be connected to the source 215a or the drain 215b of the drive transistor.

Figure 14:
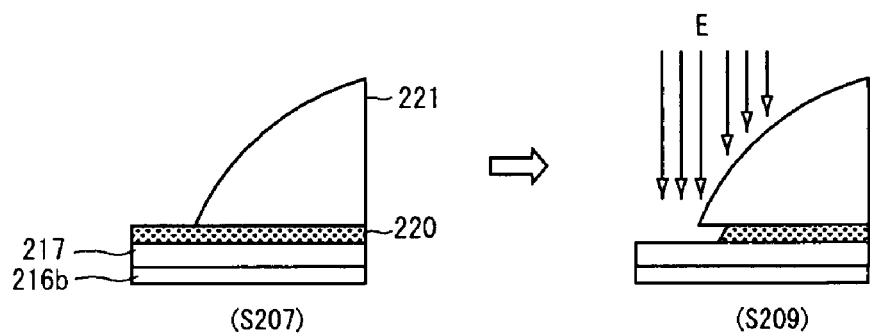

As shown in FIGS. 12 and 14, the sacrifice layer 220 is formed on the connection electrode 217 in step S205.

More specifically, the sacrifice layer 220 is formed on the connection electrode 217 to expose a portion of the connection electrode 217. The sacrifice layer 220 may include an inorganic insulating layer formed of silicon oxide ($SiO_x$) or silicon nitride ($SiN_x$). In the second exemplary embodiment of the invention, the sacrifice layer 220 is formed of silicon nitride ($SiN_x$) as an example.

As shown in FIGS. 12 and 14, the bank layer 221 is formed on the sacrifice layer 220 in step S207.

More specifically, the bank layer 221 is formed on the sacrifice layer 220 to expose a portion of the connection electrode 217. The bank layer 221 may be formed of an organic material such as benzocyclobutene (BCB)-based resin, acrylic resin, or polyimide resin.

As shown in FIGS. 12 and 14, the sacrifice layer 220 is removed using an etching method E in step S209 so that the sacrifice layer 220 is formed within the range of the length of the bank layer 221 inside the bank layer 221.

The etching method E may be a dry etching method using sulfur hexafluoride ($SF_6$) and oxygen ($O_2$), but is not limited thereto. In the etching method E, the amount of sulfur hexafluoride ($SF_6$) may be more than the amount of oxygen ($O_2$). Hence, the bank layer 221 is relatively slightly etched during a performance of the etching method E. Further, etching time does not have to be adjusted during the undercut process.

Figure 15:
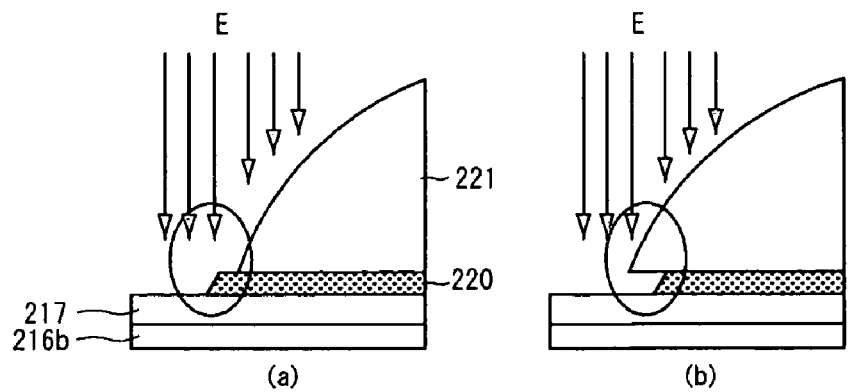

FIG. 15 shows an etching shape depending on the amount of each of sulfur hexafluoride ($SF_6$) and oxygen ($O_2$) used to remove the sacrifice layer 220. In FIG. 15, (a) shows a case where the amount of sulfur hexafluoride ($SF_6$) is less than the amount of oxygen ($O_2$), and (b) shows a case where the amount of sulfur hexafluoride ($SF_6$) is more than the amount of oxygen ($O_2$). As can be seen from FIG. 15, when the amount of sulfur hexafluoride ($SF_6$) is more than the amount of oxygen ($O_2$) in the etching method E, the sacrifice layer 220 can be formed within the range of the length of the bank layer 221 inside the bank layer 221.

Figure 16:
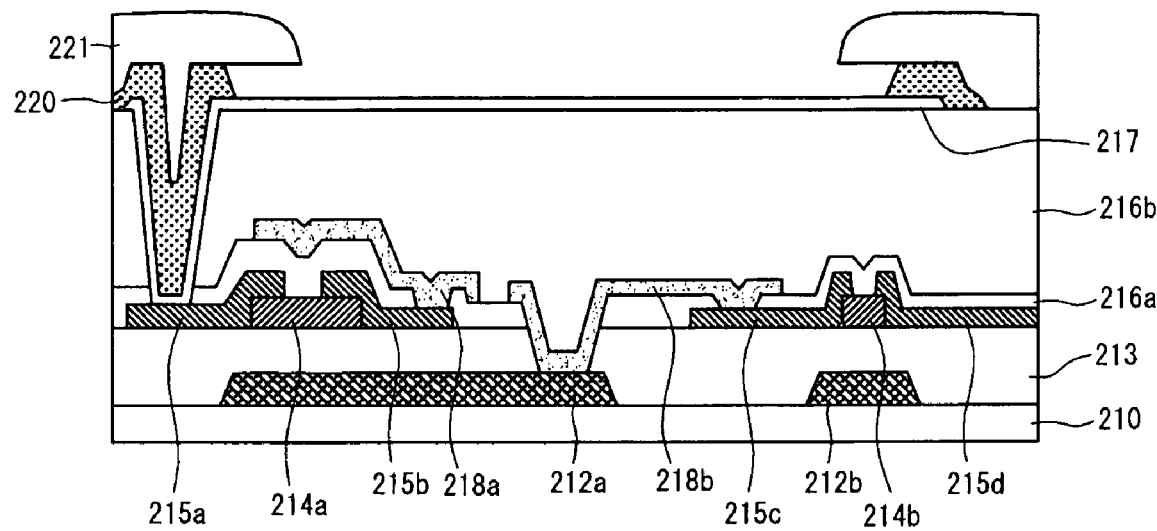

A structure shown in FIG. 16 is obtained by performing the above steps.

Figure 17:
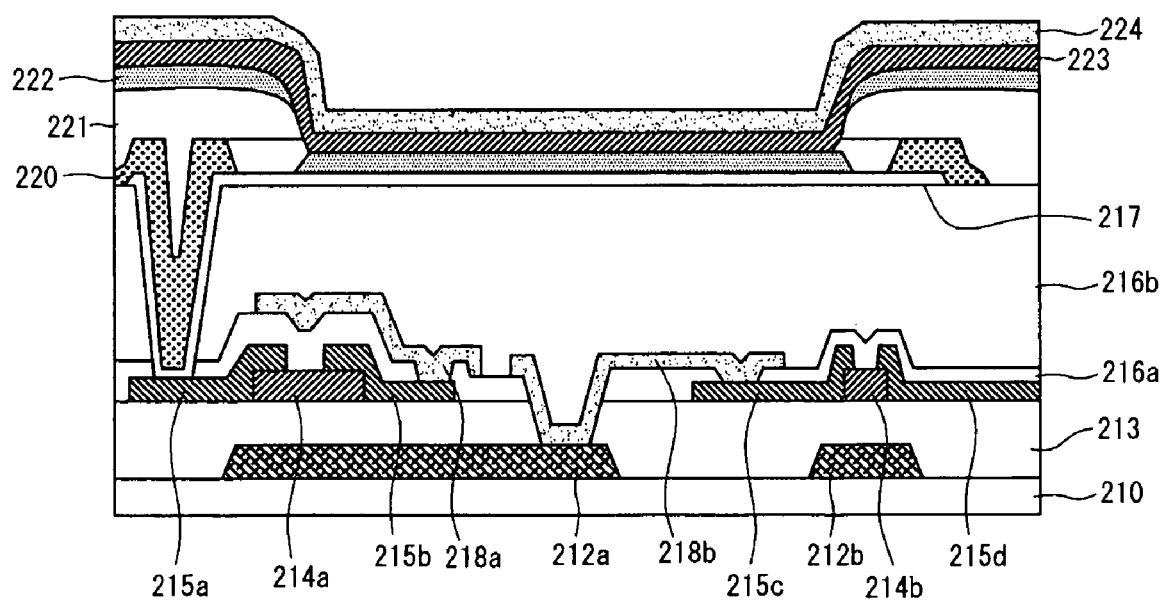

As shown in FIGS. 12 and 17, the lower electrode 222 is formed on the connection electrode 217 in step S211.

More specifically, the lower electrode 222 is positioned on the bank layer 221 as well as the connection electrode 217. The lower electrode 222 may be dividedly formed in each subpixel by the undercut sacrifice layer 220 and the bank layer 221. The lower electrode 222 may be a cathode electrode. The lower electrode 222 may be formed of an opaque material having a low work function such as Al and Al alloy, but is not limited thereto.

As shown in FIGS. 12 and 17, the organic light emitting layer 223 is formed on the lower electrode 222 in step S213. The organic light emitting layer 223 on the lower electrode 222 may emit one of red, green, and blue light depending on the subpixel.

As shown in FIGS. 12 and 17, the upper electrode 224 is formed on the organic light emitting layer 223 in step S215.

More specifically, the upper electrode 224 on the organic light emitting layer 223 may be formed throughout an upper portion of each subpixel. The upper electrode 224 may be an anode electrode. The upper electrode 224 may be formed of a transparent material such as ITO, IZO, ITZO, and ZnO-doped $Al_2O_3$ (AZO), but is not limited thereto.

In the second exemplary embodiment of the invention, because the sacrifice layer 220 is formed of the inorganic insulating layer and is thinly formed to have the thickness equal to or less than 500 Å during the undercut process, an open circuit of the upper electrode 224 caused by a difference between heights of the undercut patterns (for example, a difference between heights of the organic light emitting layers 223) can be prevented. Further, the thicknesses of the sacrifice layer 220 and the bank layer 221 used in the undercut process can be minimized, and the depth of the undercut pattern can be adjusted. Because the lower electrode 222, the organic light emitting layer 223, and the upper electrode 224 are formed through the undercut process, the oxidization of the lower electrode 222 can be prevented. Because the oxidization of the lower electrode 222 is prevented, electron injection characteristics and light emitting efficiency can be improved. Because the sacrifice layer 220 is formed of the inorganic insulating layer, an out-gassing influence (for example, the subpixel shrinkage) of organic materials under the sacrifice layer 220 can be minimized.

It will be apparent to those skilled in the art that various modifications and variations can be made in the embodiments of the invention without departing from the spirit or scope of the invention. Thus, it is intended that embodiments of the invention cover the modifications and variations of this invention provided they come within the scope of the appended claims and their equivalents.

What is claimed is:

1. An organic light emitting display comprising:
   a substrate;
   a transistor on the substrate, the transistor including a gate, a source, and a drain;
   a connection electrode that is positioned on the transistor to be connected to the source or the drain of the transistor;
   a first sacrifice layer that is positioned on the connection electrode to expose a portion of the connection electrode;
   a second sacrifice layer that is positioned on the first sacrifice layer to expose a portion of the connection electrode;
   a lower electrode on the connection electrode and the second sacrifice layer;
   an organic light emitting layer on the lower electrode; and
   an upper electrode on the organic light emitting layer,
   wherein one end of the first sacrifice layer is positioned inside one end of the second sacrifice layer, wherein the connection electrode is separated by the structure of the first sacrifice layer and the second sacrifice layer in each subpixel.

2. The organic light emitting display of claim 1, wherein the first sacrifice layer includes an inorganic insulating layer.

3. The organic light emitting display of claim 1, wherein the second sacrifice layer is formed of metal or metal oxide.

4. An organic light emitting display comprising:
   a substrate;
   a transistor on the substrate, the transistor including a gate, a source, and a drain;
   a connection electrode that is positioned on the transistor to be connected to the source or the drain of the transistor;
   a sacrifice layer that is positioned on the connection electrode to expose a portion of the connection electrode;
   a bank layer that is positioned on the sacrifice layer to expose a portion of the connection electrode;
   a lower electrode on the connection electrode and the bank layer;
   an organic light emitting layer on the lower electrode; and
   an upper electrode on the organic light emitting layer,
   wherein one end of the sacrifice layer is positioned inside one end of the bank layer, wherein the connection electrode is separated by the structure of the sacrifice layer and the bank layer in each subpixel.

5. The organic light emitting display of claim 4, wherein the first sacrifice layer includes an inorganic insulating layer.

* * * * *